United States Patent [19]
Swart

[11] Patent Number: 5,744,948
[45] Date of Patent: Apr. 28, 1998

[54] PRINTED CIRCUIT BOARD HANDLING DEVICE

[75] Inventor: Mark A. Swart, Upland, Calif.

[73] Assignee: Everett Charles Technologies, Inc., Pomona, Calif.

[21] Appl. No.: 515,455

[22] Filed: Aug. 15, 1995

[51] Int. Cl.$^6$ .................................................. G01R 31/02
[52] U.S. Cl. ........................................ 324/158.1; 324/758
[58] Field of Search .................................. 324/158.1, 758

[56] References Cited

U.S. PATENT DOCUMENTS

| | | | |
|---|---|---|---|
| 4,245,940 | 1/1981 | Luther et al. | 414/95 |
| 4,273,321 | 6/1981 | Luther et al. | 271/10 |
| 4,359,162 | 11/1982 | Mayer et al. | 211/41 |
| 5,285,149 | 2/1994 | Galdik et al. | 324/158 F |
| 5,442,299 | 8/1995 | Caggiano . | |

Primary Examiner—Ernest F. Karlsen
Assistant Examiner—Anh Phung
Attorney, Agent, or Firm—Christie, Parker & Hale, LLP

[57] ABSTRACT

A test fixture assembly releasably retains a printed circuit board on a test fixture and facilitates transfer of the board to and removal of the board from the fixture during a sequential test operation in which circuit boards under test are held in a test position, tested by a printed circuit board test apparatus, removed from the test position, and unloaded from the fixture, followed by receiving further boards in sequence for testing. The test fixture includes conductive test pins aligned with circuits on the board to be tested, and at least one board retaining assembly mounted to the fixture. The board retaining assembly includes a board retaining device positioned adjacent a surface of the test fixture and affixed to a free end of an elongated support member rigidly connected to the fixture. The free end of the support member moves angularly in response to a lateral force applied by the edge of the board moving over a cam surface of the board retaining device and into releasable engagement with a retaining section of the device. The support member mounts the board retaining device in a first position releasably engaging an edge of the circuit board to firmly hold the board on the test fixture. A subsequent lateral force applied to the board retaining device moves the retaining section of the device to a second position released from engagement with the edge of the board to thereby facilitate removal of the board from the test fixture.

10 Claims, 9 Drawing Sheets

PRINTED CIRCUIT BOARD HANDLING DEVICE

FIELD OF THE INVENTION

The present invention relates generally to a device used to facilitate the removal of printed circuit boards from a printed circuit board test fixture, and more specifically, to a device that removes a tested printed circuit board from a bottom test fixture and that releasably retains the printed circuit board adjacent a surface of a top test fixture and is capable of releasing the printed circuit board by manual or mechanical means.

BACKGROUND OF THE INVENTION

Printed circuit boards (PCBs) are generally tested prior to shipment to an assembler by using a bare board test apparatus using one or more PCB test fixtures. Each test fixture includes a number of electrical contacts in the form of spring-loaded test probes configured within the test fixture in a pattern corresponding to a desired test circuit or circuits on the PCB. Generally, there is an upper or top and a lower or bottom test fixture, each having probes configured to test electrical circuits on both sides or surfaces of a PCB. The upper and lower test fixtures are mounted and electrically wired to respective upper and lower portions of the board test apparatus. The board test apparatus is electrically connected to a test analyzer configured to generate a desired test signal.

The PCB to be tested is placed on the surface of the lower test fixture and is held in place by one or more tooling pins that project from the surface and extend through tooling pin holes in the PCB. The lower test fixture and upper test fixture are brought together, by the movement of one or both test fixtures, so that the probes of the upper and lower test fixtures are in contact with circuit portions on respective top and bottom surfaces of the PCB. The test analyzer transmits a desired test signal through the test fixtures to the circuit portions of the PCB and analyzes the performance of the PCB to determine whether the circuits pass or fail the test.

After the PCB has been tested, the test apparatus is operated so that the upper and lower test fixtures are separated from one another. An operator reaches into the test apparatus and removes the tested PCB from the tooling pins, places the tested PCB in a pass or fail stack, and places a new PCB on the tooling pins for testing. The task of manually unloading a tested PCB from the lower test fixture before a new PCB can be loaded into the board tester makes PCB testing a series operation, which ultimately increases the amount of time associated with testing each PCB. The amount of time associated with such a series test operation is especially undesirable when a large number of PCBs are to be tested.

It is desirable that a board handling device be constructed that speeds up the testing of PCBs by removing the tested PCB from the board test apparatus in a manner allowing an operator or mechanical device to reload the board tester as a parallel procedure, i.e., simultaneous PCB removal and reloading, or to reload the board tester in a more efficient series procedure, i.e., quick removal of the tested PCB before or after reloading. It is desired that the board handling device facilitate use with conventional test fixtures and board testers. It is also desirable that the device facilitate PCB removal either manually or mechanically.

SUMMARY OF THE INVENTION

Briefly, this invention provides a printed circuit board handling device adapted for use with a printed circuit board test apparatus to facilitate board removal from a test fixture and board reloading on a test fixture mounted in the circuit board test apparatus. A board handling device constructed according to principles of this invention is adapted for mounting to a laterally movable support member on the test fixture so that a portion of the device projects outwardly a distance away from a surface of the test fixture.

The board handling device has a tip portion adjacent a first end of the device extending axially a distance along the device to an enlarged diameter section of the device. The enlarged diameter section has an outside diameter that is larger than a diameter of the tip portion, and has an outside surface adapted to permit passage of an edge portion of a printed circuit board during use. The outside surface can have a cam-shaped configuration to facilitate passage of the edge portion of the printed circuit board by producing lateral movement of the device. The enlarged diameter section extends axially a distance along the device away from the tip portion to a retaining section. The retaining section has an outside surface adapted to engage and retain the edge portion of the printed circuit board after it has passed over the enlarged diameter section. The outside surface of the retaining section can be configured as an edge surface, a high-friction surface, or the like. The retaining section has a diameter that is less than or equal to an outside diameter of the enlarged diameter section. The retaining section extends axially a distance along the device from the enlarged diameter section to a second end of the device.

The second end of the device is adapted for attachment to the laterally movable support member of the test fixture. The device is adapted to be mounted on the support member so that the tip portion, enlarged diameter section, and retaining section each project outwardly a distance away from the surface of the test fixture to facilitate engagement with a printed circuit board mounted on an opposed test fixture.

A sufficient number of the board handling devices are disposed within the test fixture to contact and engage edge portions of the printed circuit board when the test apparatus is placed in a test position. When placed in the test position, the enlarged diameter section of each device contacts an adjacent edge portion of printed circuit board, causing each respective device to be displaced laterally away from the printed circuit board. The edge portion of the printed circuit board passes completely over and around the enlarged diameter section and passes into and is engaged by the retaining section of each device, which retains the printed circuit board against the surface of the test fixture when the device is placed in a post-test position.

Manual or mechanical means can be used to release the retained printed circuit board by applying an outwardly directed pressure to the tip portions of each device, causing the printed circuit board to be released from the retaining section of each device and removed from the test apparatus. Use of board handling devices constructed according to principles of this invention reduce the amount of time associated with printed circuit board testing because they allow an operator to remove a tested printed circuit board and load a new printed circuit board as a parallel operation, i.e., they eliminate the need to first remove a test printed circuit board from the test apparatus before a new printed circuit board can be loaded for testing.

BRIEF DESCRIPTION OF THE DRAWINGS

These and other features and advantages of the present invention will become appreciated as the same becomes better understood with reference to the specification, claims and drawings wherein:

DETAILED DESCRIPTION

This invention comprises a printed circuit board (PCB) handling device that, when mounted within a test fixture used in a bare board test apparatus for testing PCBs, removes the tested PCB from tooling pins on a lower or bottom test fixture to facilitate unloading the tested PCB from and reloading a new PCB into the test apparatus. A PCB handling device constructed according to principles of this invention projects outwardly a distance from a surface of the test fixture and has an outside surface configured to (1) pass over an edge portion of the PCB, (2) engage the edge portion of the PCB and (3) retain the PCB adjacent the test fixture surface.

Figure 1:
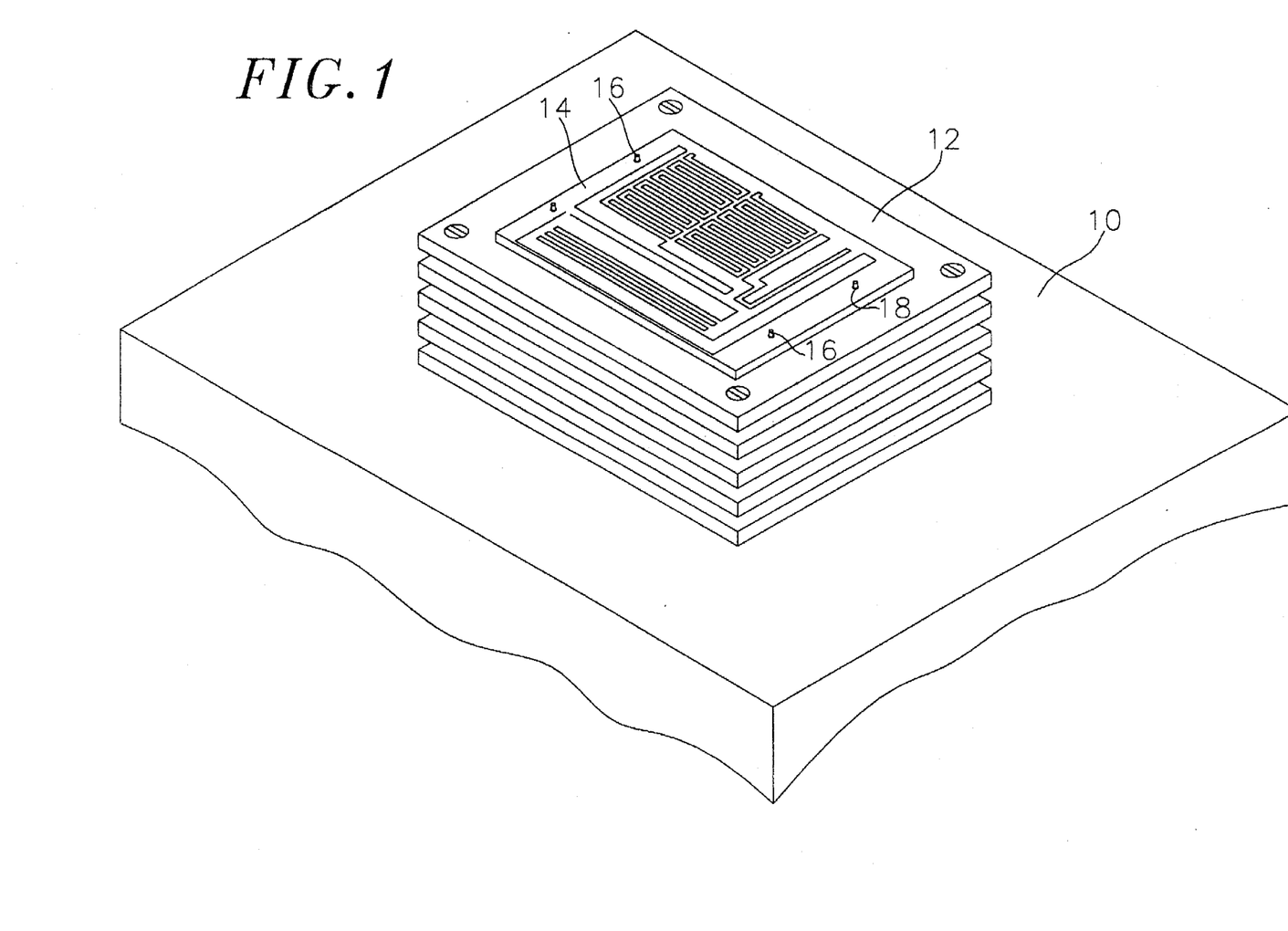
FIG. 1 is a fragmentary perspective view of a bottom plate of a bare board test apparatus, including a bottom board test fixture mounted thereon.

FIG. 1 illustrates a bottom or lower plate 10 of a bare board test apparatus. A bottom or lower PCB test fixture 12 is attached to the bottom plate 10 and can be electrically connected to the test apparatus by either wire-type or grid-type connections. A PCB 14 is disposed on an upper surface of the bottom PCB test fixture 12 and is maintained in position on the test fixture by one or more tooling pins 16 that each project from the surface of the bottom test fixture and through tooling pin holes 18 at the margin of the PCB.

Figure 2:
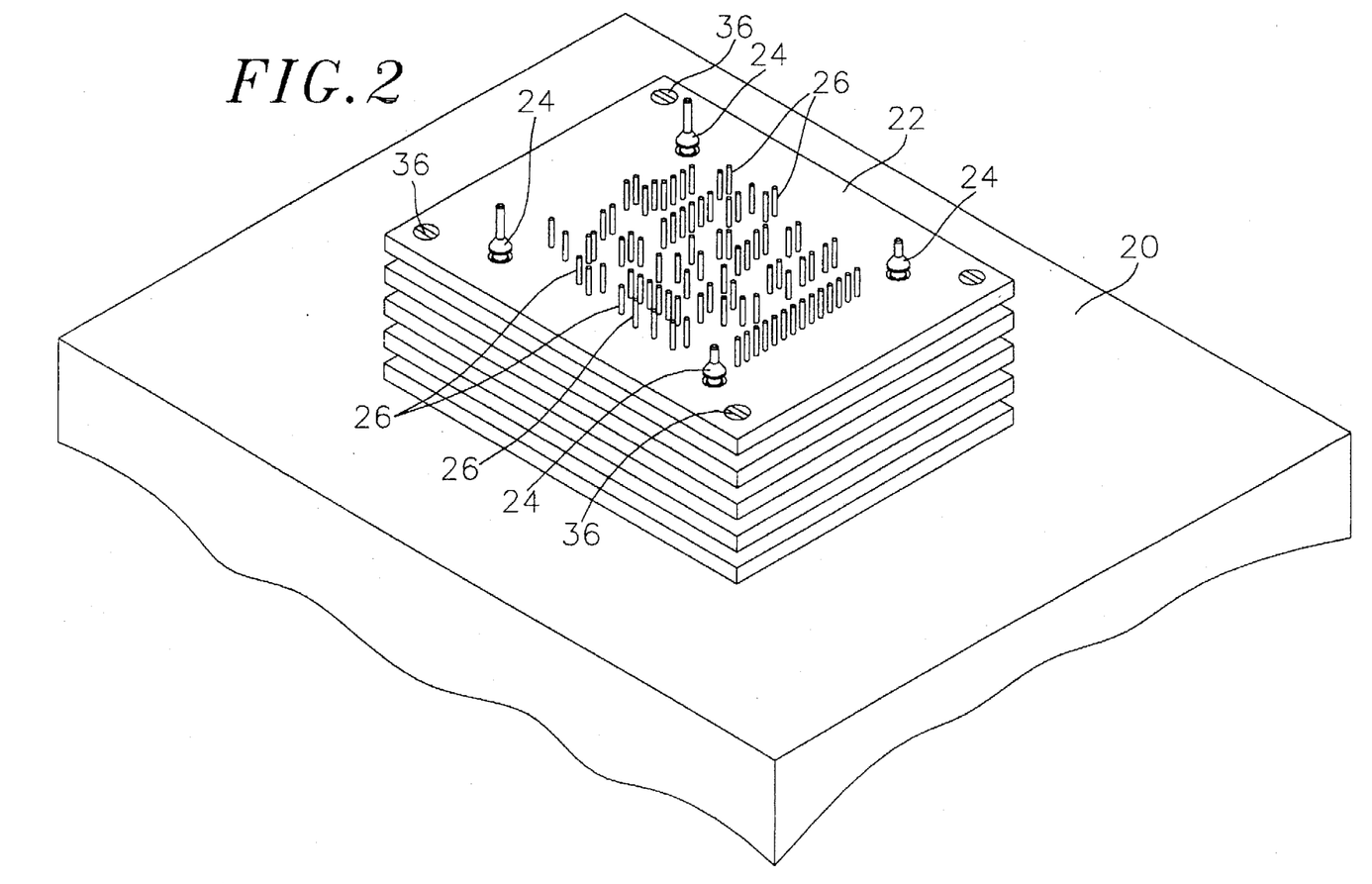
FIG. 2 is a fragmentary perspective view of a top plate of a bare board test apparatus, including a top board test fixture mounted thereon and a number of board handling devices constructed according to principles of this invention.

FIG. 2 illustrates a top plate 20 of the bare board test apparatus that includes a top or upper test fixture 22 attached thereto (the top plate and upper fixture are shown in FIG. 2 rotated 180° from their normal downwardly facing orientation during use.) As with the bottom test fixture 12, the top test fixture 22 can be electrically connected to the top plate 20 by either wire-type or grid-type connections. The top test fixture 22 includes a number of PCB handling devices 24, constructed according to principles of this invention, that each project outwardly (downwardly in normal operation) from a surface of the top test fixture 22.

Figure 3:
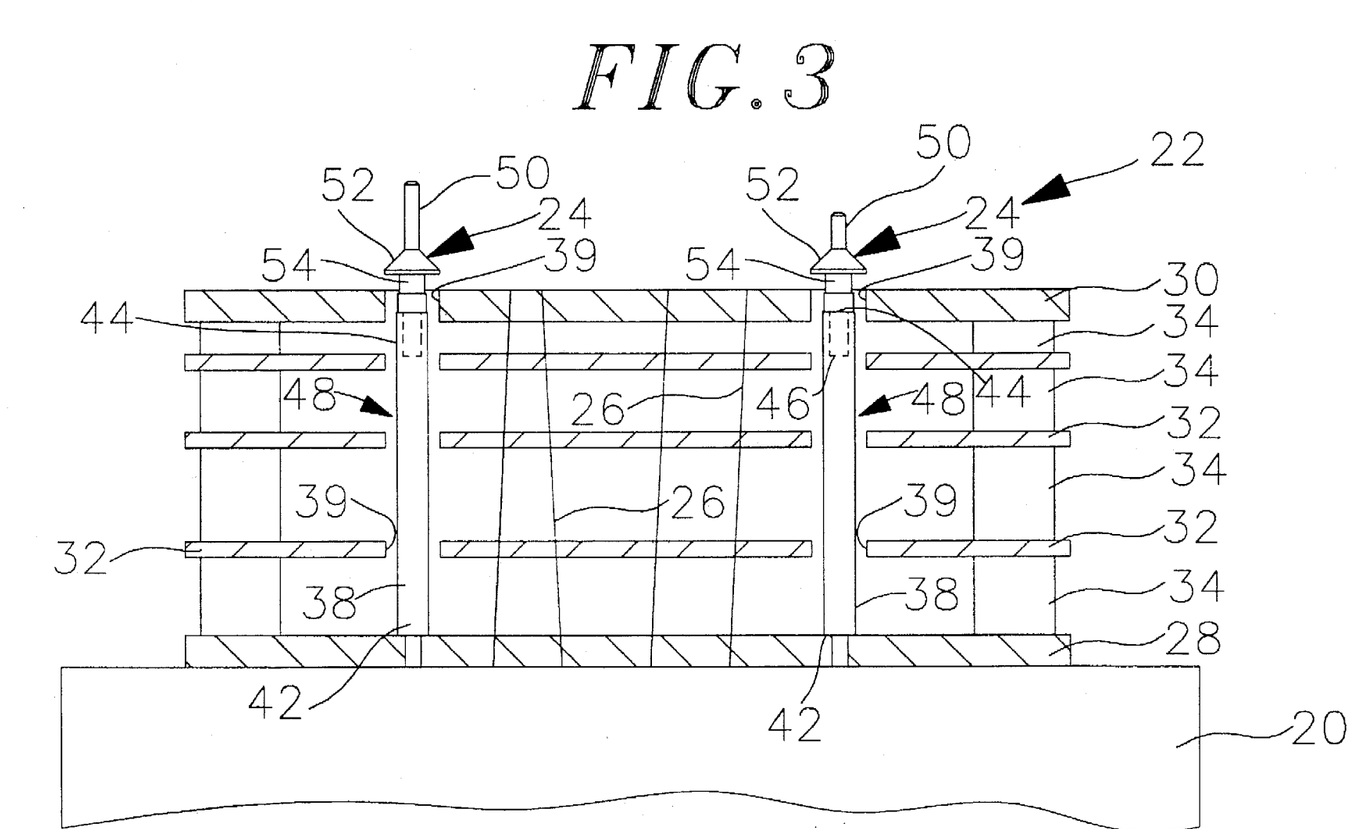
FIG. 3 is fragmentary semi-schematic cross-sectional view of the test fixture shown in FIG. 2.

FIG. 3 is a detailed view of the top test fixture 22, illustrating the PCB handling devices 24 and placement of the devices within the test fixture 22. It is to be understood that the top test fixture 22 is identical to the bottom test fixture 12 shown in FIG. 1 in that both include a number of test probes 26 disposed between probe support plates of the fixture. The probe support plates include a baseplate 28 and a faceplate 30 extending parallel to each other along the bottom and top sides of the test fixture, respectively. A number of vertically spaced apart, parallel intermediate dielectric plates 32 are interposed between the baseplate 28 and faceplate 30 of each test fixture 12 and 22. The intermediate plates are used to align the test probes 26 within the respective test fixtures. The baseplate 28, faceplate 30, and intermediate plates 32 are connected to one another by dielectric spacers 34 interposed between the plates and held in position by screws 36 (shown in FIG. 2). The test probes 26 are arranged within the test fixtures 12 and 22 to make contact with one or more circuit traces on respective surfaces of the PCB 14 when the PCB test apparatus is placed in a test position.

Standoffs 38 disposed within openings 39 in the probe support plates of the test fixture 22 extend from the baseplate 28, through the intermediate plates 32 to the faceplate 30. Each standoff 38 is rigidly attached at a fixed end 42 to the baseplate 28 by conventional attachment means, such as by threaded attachment. Each standoff 38 is shaped in the form am elongated narrow cylindrical rod and is made from an electrically nonconductive material that is capable of bending laterally a desired amount in response to lateral forces imposed on a free end 44 opposite the fixed end 42. In a preferred embodiment, each standoff 38 is made of a semi-rigid bendable plastic material. The openings 39 through the intermediate plates 32 and the faceplate 30 are sized having a diameter larger than an outside diameter of respective standoffs 38 to permit a predetermined angular range of free lateral movement of the standoffs within the test fixture 22. Additionally, each standoff 38 is positioned eccentrically within the openings 39. Eccentric positioning of the standoffs permits maximum lateral movement of the standoffs 38 within the openings in a direction away from a respective edge of a PCB mounted on the faceplate 30.

A separate PCB handling device 24, constructed according to principles of this invention, has a long, narrow externally threaded attachment end 46 affixed to an internally threaded free end 44 of each standoff 38. The combined standoffs and board handling devices thereby form a PCB handling device/standoff assembly 48. Each PCB handling device 24 is attached to a respective standoff 38 so that the device 24 projects outwardly a predetermined distance away from a board mounting surface of the faceplate 30. The number of standoffs 38 included in a test fixture is dependent on the particular number of PCB handling devices 24 needed to retain the PCB, which can depend on such factors as the shape and size of the PCB to be tested.

Figures 4A, 4B, 4C:
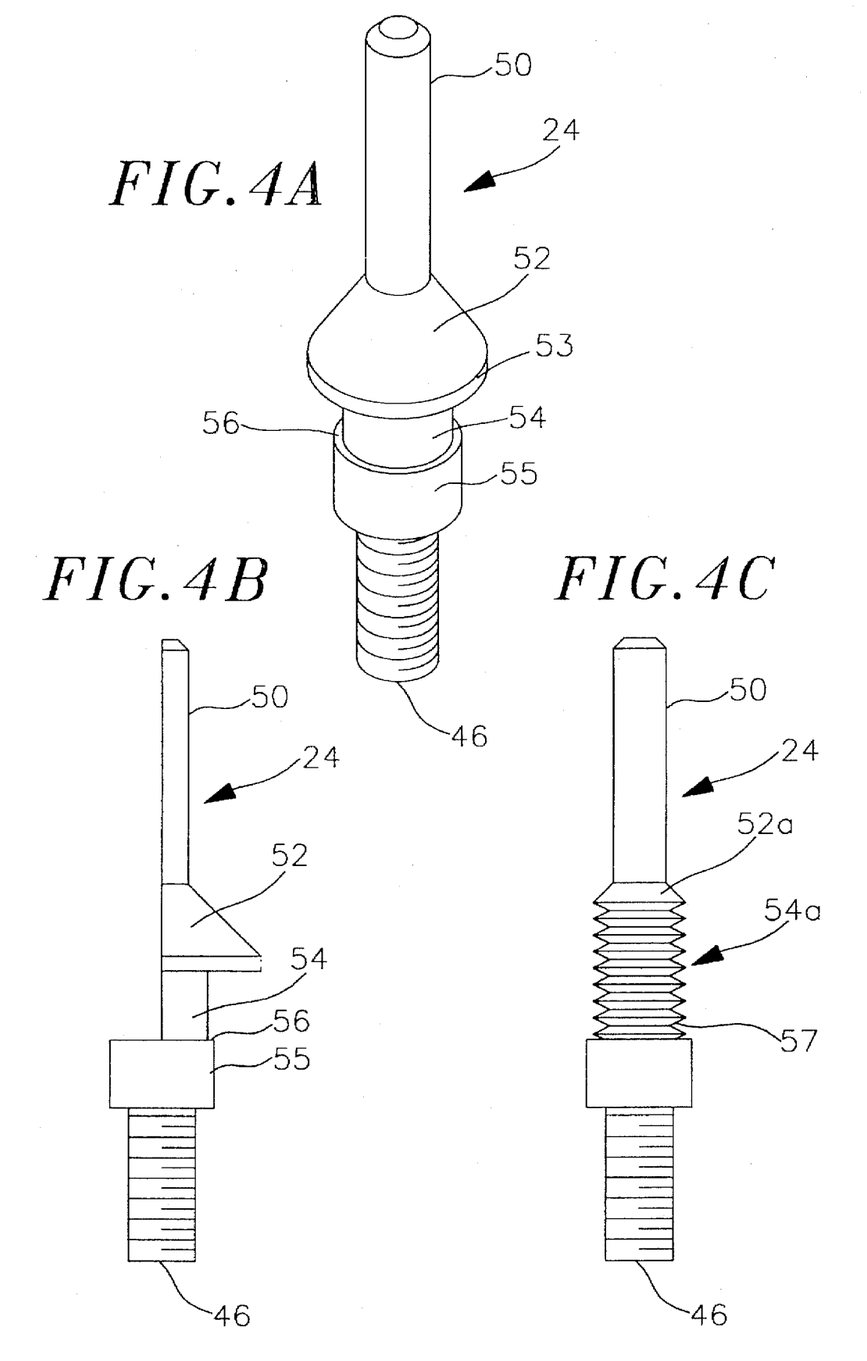
FIGS. 4A–4C are perspective views of differently configured board handling devices constructed according to principles of this invention.

Referring now to FIGS. 3 and 4A, a PCB handling device 24, constructed according to principles of this invention, includes a long, narrow cylindrical tip portion 50, opposite from the attachment end 46, and an enlarged diameter section 52 adjacent the tip portion 50 having an outer surface shaped to facilitate passage over an edge of the PCB 14 by lateral movement of a respective standoff that holds the device 24. The enlarged diameter section 52 has a cam-shaped or tapered surface that causes lateral movement of the device/standoff assembly 48 when contacting an edge portion of a PCB 14 mounted on the faceplate 30. In a preferred embodiment, illustrated in FIGS. 3 and 4A, the enlarged diameter section 52 has a conical-shaped surface that tapers wider in an axial direction away from the tip portion 50 of the device. A conical-shaped surface is preferred because it is symmetrical relative to the rotational position of the handling device on a respective standoff and is, therefore, able to effect lateral movement of the device/standoff assembly 48 regardless of its rotational orientation vis-a-vis an adjacent PCB edge.

Moving axially from the enlarged diameter section 52 toward the attachment end 46, the handling device 24 includes a short cylindrical PCB retaining section 54 of reduced outside diameter shaped to engage and retain or hold an edge portion of the PCB after the enlarged diameter section 52 has passed over the edge of the PCB 14. Accordingly, after the enlarged diameter section 52 of the handling device has passed over the edge of the PCB by applying an outward force that bends the standoffs away from the board, the board passes under the maximum diameter end 53 of the enlarged section 52, whereupon the retaining section 54 engages the edge of the PCB by a return snap action of the device/standoff assembly 48. Engagement of the PCB retaining section 54 against the edge of the PCB traps the PCB between the handling devices positioned about the perimeter of the PCB.

The device 24 also includes a short cylindrical section 55 of slightly enlarged diameter extending away from the retaining section 54 toward the attachment end 46. The section 55 forms an annular shoulder 56 spaced axially below the bottom of the enlarged section 52. This forms the retaining section 54 as a uniform diameter recessed cylindrical region between the flanged bottom of the conical enlarged section and the shoulder 56.

In a preferred embodiment, the tip portion 50 has a diameter of approximately 3 millimeters, and the enlarged diameter section has an axial length of approximately 6.3 millimeters and a maximum end diameter of approximately 9.5 millimeters at the edge 53. The tip portion has an axial length sufficient to facilitate lateral movement of the device by mechanical or manual means. The recessed retaining section 54 has an axial length sufficient to accommodate the thickness of an edge portion of the PCB. In a preferred embodiment, the retaining section has an axial length of approximately 9.5 millimeters and has a diameter of approximately 6.3 millimeters. The threaded end section 46 is sized to complement threadable connection with a standoff. In a preferred embodiment, the threaded end has an axial length of approximately 9.5 millimeters.

The handling device 24 may have an enlarged diameter section 52 and a retaining section 54 shaped differently than that specifically described above and illustrated in FIGS. 3 and 4A. For example, referring to FIG. 4B, a handling device 24 constructed according to principles of this invention may have an enlarged diameter section 52 shaped having a tapered surface with a semi-conical-shaped profile. Unlike the handling device 24 having a cone-shaped enlarged diameter section, the handling device having the enlarged diameter section 52 with a semi-cone-shaped profile is asymmetric with respect to its axis. When installed on a respective standoff, it is necessary that a handling device shaped in such a manner be oriented with the sloped surface portion facing the PCB edge. When oriented in this manner, interaction between the sloped surface and the PCB edge causes the device/standoff assembly to bend outwardly away from the PCB to facilitate passage of the enlarged diameter section 52 around the edge of the board.

The embodiment of the handling device illustrated in FIG. 4B, having a semi-cone-shaped profile, has a retaining section 54 similar to that described above and illustrated in FIG. 4A, comprising a recessed region below the tapered surface. After the tapered surface of each PCB handling device has passed over the PCB edge, the recessed retaining sections 54 releasably trap the PCB between PCB handling devices.

Referring to FIG. 4C, the handling device 24 may also have an enlarged diameter section 52a shaped in the form of a cone-shaped surface of shortened length and diameter. This section has a tapered surface with a diameter approximately the same as the diameter of an adjacent retaining section 54a. In such an embodiment, the enlarged diameter section 52a passes over an edge of the PCB by virtue of its conical-shaped surface and resulting leverage action of the device/assembly 48 standoff. After the expanded diameter section 52a has passed over the edge of the PCB, the edge of the PCB contacts the retaining section 54a. In this embodiment the section 54a is configured as a friction surface, such as one formed from a plurality of axially spaced apart ribs 57 or the like, to ensure that the edge of the PCB does not slip away from its frictional contact with the handling device 24 and, thus remains releasably trapped between the PCB handling devices.

PCB handling devices constructed according to principles of this invention may be formed from any type of structurally rigid material. It is desired that the handling device be formed from an electrically nonconductive material to eliminate the possibility of conduction during testing from contact between the handling device and the PCB. Additionally, a low friction material is used to form the handling device to facilitate passage of the enlarged diameter section 52 over the PCB. Suitable materials for forming the handling device include polymeric materials such as Teflon, nylon, graphite composites, Kevlar composites, ceramics, and mixtures thereof. A particularly preferred material is a composite of Kevlar and nylon sold under the name Hydlaz and made by DuPont. This material is preferred because of its properties of high rigidity and stiffness, excellent wear resistance, and low friction.

Each PCB handling device/standoff assembly 48 is positioned within the test fixture 22 to allow the retaining section 54 of each handling device to engage an edge of the PCB. The number of PCB handling device/standoff assemblies 48 employed in the test fixture is dependent upon, among other things, both the size and configuration of the particular PCB to be tested. For example, for a square or rectangular-shaped PCB, four PCB handling device/standoff assemblies may be used, as illustrated in FIG. 2. In another example, for an oval or circular-shaped PCB, three PCB handling device/standoff assemblies may be used.

The number and/or placement of each PCB handling device/standoff assembly 48 within the test fixture may also depend upon the particular method used to remove or unload the PCB from the PCB handling devices after the test has been performed to facilitate such removal. The PCB handling devices may be operated manually or mechanically to release the trapped PCB.

Figure 5:
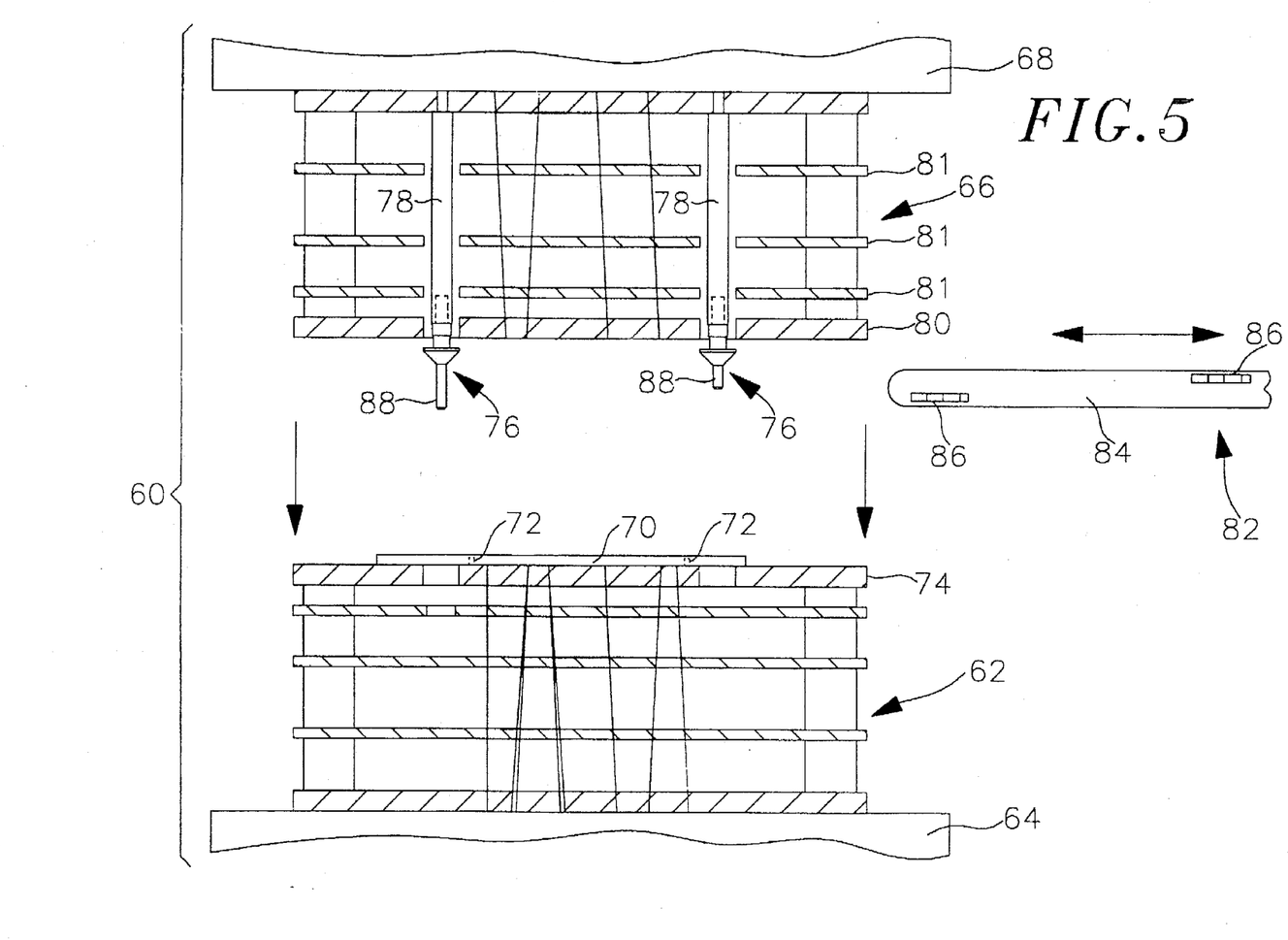
FIG. 5 is a fragmentary semi-schematic side elevational view of a bare board test apparatus used with a mechanical unloading apparatus, the test apparatus being in a loaded pre-test position, and including a top plate and a test fixture having multiple board handling devices constructed according to principles of this invention.

FIG. 5 illustrates a fragmentary semi-schematic view of a bare board test apparatus 60 which includes a bottom test fixture 62 attached to a bottom plate 64 of the test apparatus, and a top test fixture 66 attached to a top plate 68 of the test apparatus. A PCB 70 is mounted by tooling pins 72 on a surface of the faceplate 74 of the bottom test fixture 62. For purposes of illustration, the PCB 70 has a rectangular shape.

The top and bottom test fixtures 66 and 62 are the same as the top and bottom test fixtures described above and illustrated in FIGS. 1, 2 and 3.

FIG. 5 illustrates the bare board test apparatus 60 in a loaded pre-test position. PCB handling devices 76, constructed according to principles of this invention, are attached to the ends of standoffs 78 and project outwardly from a surface of the faceplate 80 of the top test fixture 66. The standoffs extend through vertically aligned holes in the test fixture intermediate plates 81 and the faceplate 80. For purposes of illustration and reference, four PCB handling devices 76 are used to accommodate the rectangular shape of the PCB. The PCB handling devices 76 are arranged within the top test fixture 66 in oppositely oriented pairs, so a pair of the devices engage common edges of the PCB that are opposed to one another during testing, as best shown in FIG. 2.

It is to be understood that PCB handling devices of this invention have been illustrated as being used with a mechanically operated press-type test apparatus for purposes of reference and illustration, and that PCB handling devices of this invention can be used with any type of PCB test apparatus, such as a shuttle-type test apparatus, clamshell-type test apparatus, and the like.

The test apparatus 60 is illustrated in FIG. 5 as being used with a mechanical unloading apparatus 82 which includes a pair of arms 84 mechanically operated to move into the test apparatus 60 between the top and bottom test fixtures when the test apparatus is in a retracted post-test position, described below. Each arm 84 may include one or more extending sections 86, either integral with each respective arm or attached as a separate member, positioned along an outer surface of each arm and projecting outwardly from each arm surface. The extending section 86 is positioned on each arm and configured to make contact with the tip portion 88 of each PCB handling device 76 as the arms 84 are moved into the test apparatus 60.

Figure 6A:
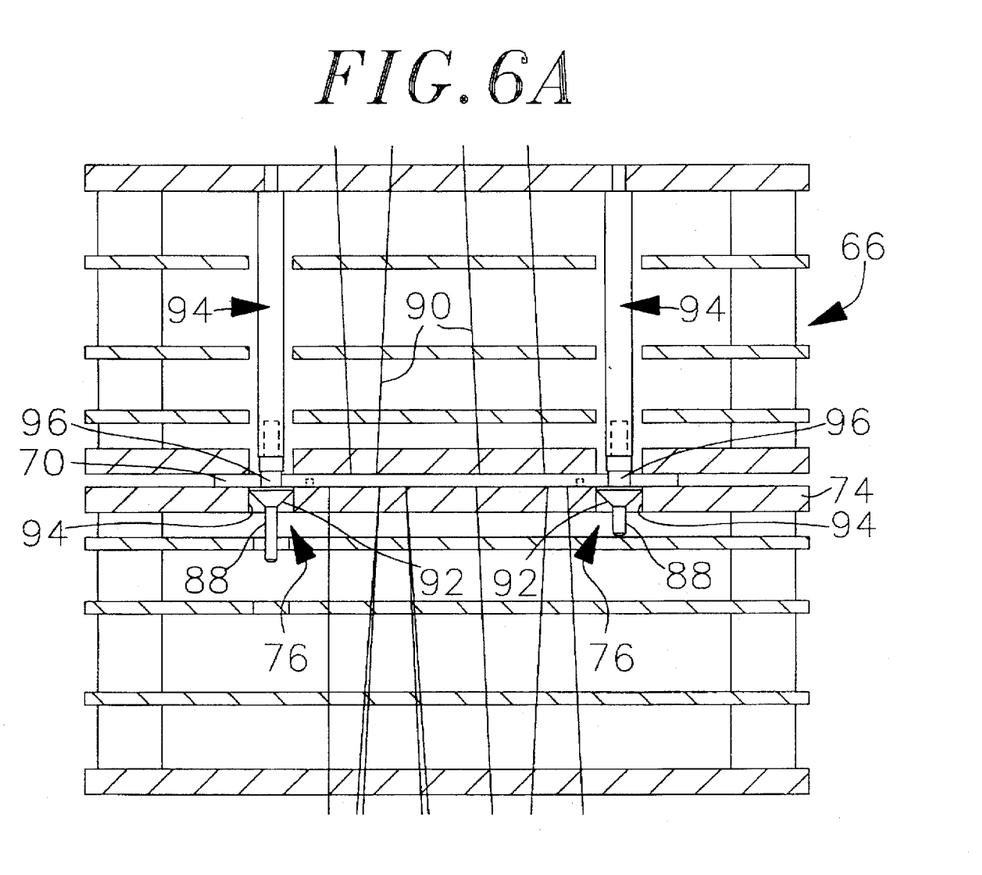
FIG. 6A is a fragmentary semi-schematic side elevational view of the bare board test apparatus of FIG. 5 in a test position.

Referring now to FIG. 6A, a detailed schematic view of the top and bottom fixtures 66 and 62 of the test apparatus 60 of FIG. 5 is illustrated in the test position. The test apparatus 60 is placed in a test position by moving the top test fixture 66 downward toward the bottom test fixture 62 so that the test probes 90 disposed within the top test fixture 66 make contact with desired test points of circuits on a top surface of the PCB 70. As the top test fixture 66 is moved downward onto the PCB, the expanded diameter section 92 of each PCB handling device 76 moves laterally over and around a respective edge of the PCB by a leverage action of each respective PCB handling device/standoff assembly 94. In FIG. 6A, such lateral movement would be in a direction toward the viewer.

When in the test position, the tip portion 88 and enlarged diameter section 92 of each PCB handling device 76 are contained within a respective opening 94 disposed within the faceplate 74 of the bottom test fixture 62. Retaining sections 96 of each PCB handling device 76 engage an adjacent respective edge of the PCB 70 when in the test position.

Figure 6B:
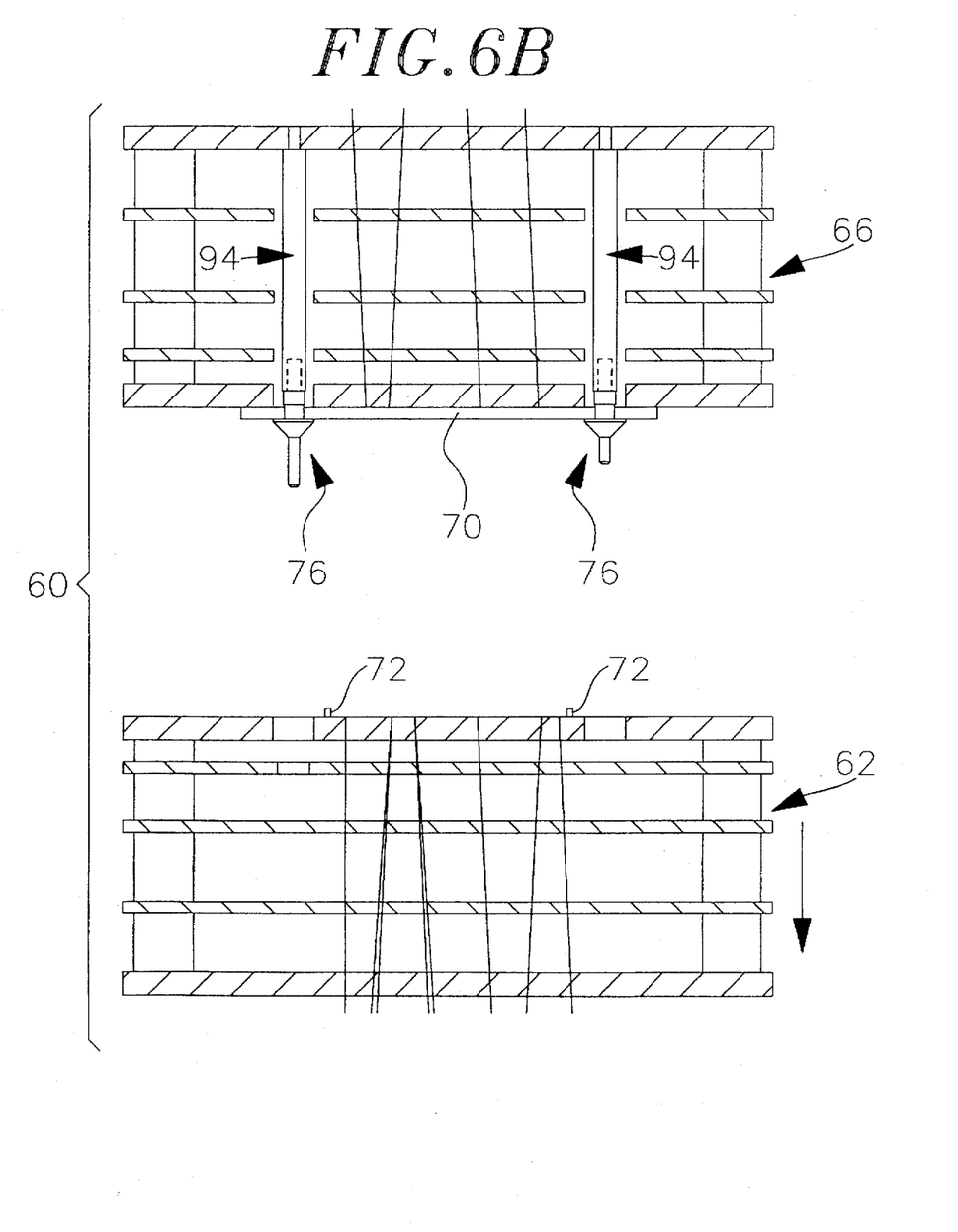
FIG. 6B is a fragmentary semi-schematic side elevational view of the bare board test apparatus of FIG. 5 in a retracted post-test position.

FIG. 6B illustrates the top and bottom fixtures 66 and 62 of the test apparatus 60 of FIG. 5 in a retracted post-test position. The test apparatus 60 is placed in the retracted post-test position by moving the top fixture 66 upward, away from the surface of the bottom test fixture 62. When the top test fixture 66 is moved upward, the PCB 70 retained by the PCB handling devices 76 follows the top test fixture 66 and is thereby lifted and removed from the tooling pins 72 which project from the surface of the bottom test fixture 62.

Removal of the PCB 70 from the bottom test fixture by the PCB handling devices 76 during upward movement of the top test fixture 66 eliminates an otherwise separate process step of having to remove the PCB 70 from the tooling pins 72 sequentially in time after the board is tested. Eliminating the need for a separate unloading or removing step in sequence helps to improve the efficiency of performing PCB tests using such test apparatus because the step of removing the PCB from the bottom test fixture is one conventionally done by hand, and is also one that must necessarily be done before another PCB can be loaded onto the bottom test fixture for subsequent testing.

Figure 6C:
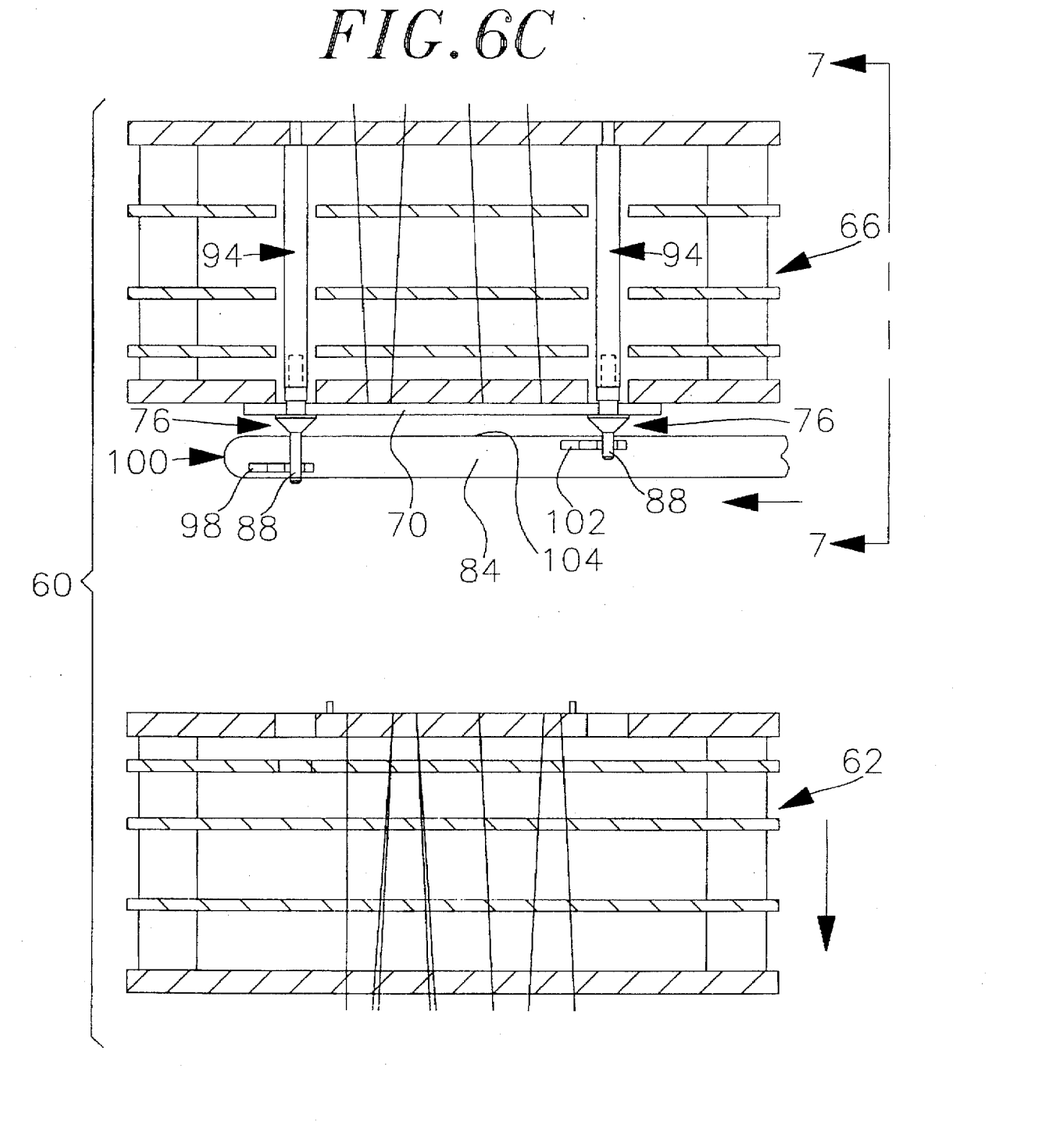
FIG. 6C is a fragmentary semi-schematic side elevational view of the bare board test apparatus of FIG. 5 in a retracted post-test position, illustrating placement of the mechanical unloading apparatus against the board handling devices.

FIG. 6C illustrates the top and bottom fixture 66 and 62 of the test apparatus 60 of FIG. 5 in a retracted post-test position with each PCB handling device/standoff assembly moved laterally outward away from the PCB by moving the mechanical arms 84 against respective PCB handling devices 76 to thereby release the PCB 70, as described in more detail below. It is to be understood that each PCB handling device/standoff assembly 94 can be moved laterally away from a respective edge of the PCB by a number of different methods. For example, each PCB handling device 76 can be moved laterally away from the adjacent edge of the PCB by hand, e.g., by manually pushing against the tip portion of each PCB handling device with one's hand or fingers, or by machine, e.g., by using a mechanical mechanism to push against the tip portion of each PCB handling device.

Figure 7:
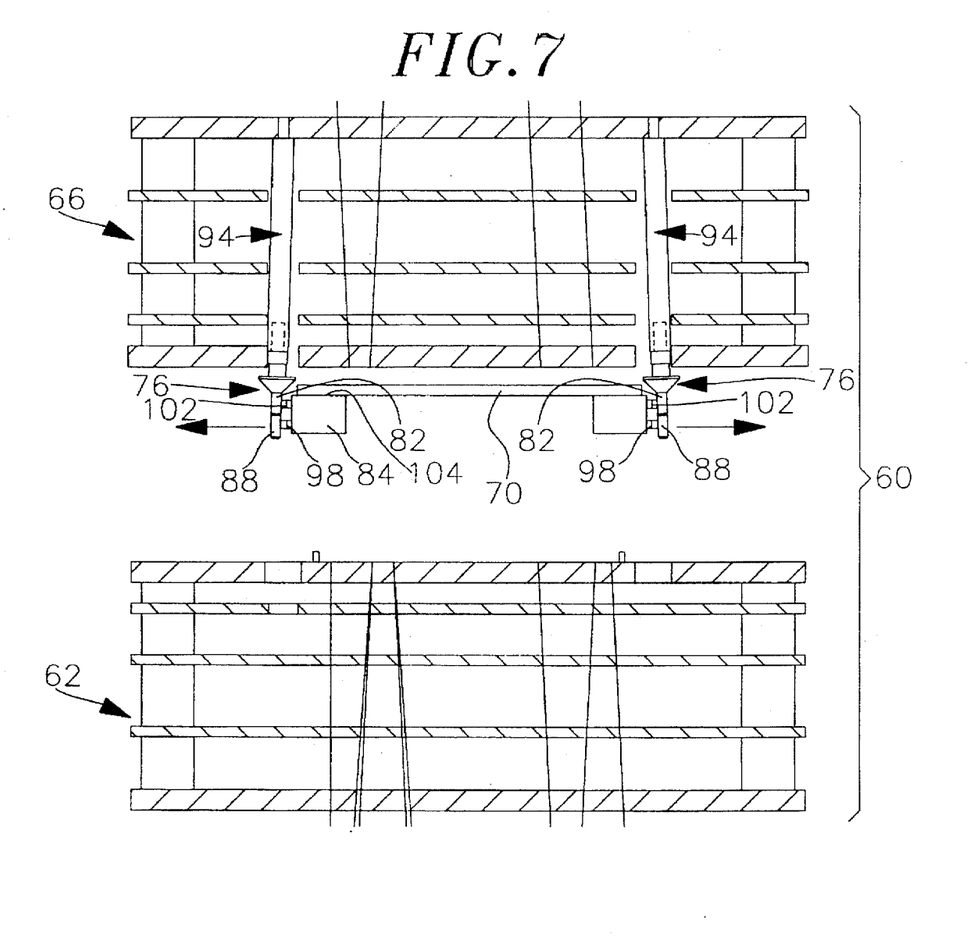
FIG. 7 is a fragmentary semi-schematic end view of the bare board test apparatus of FIG. 5 in a retracted post-test position, illustrating use of the mechanical board unloading apparatus to release the board from the board handling devices.

Referring to FIGS. 6C and 7, the test apparatus 60 shown in FIG. 5 is illustrated in a retracted post-test position with mechanical arms 84 positioned between the top and bottom test fixtures 66 and 62, respectively. As the arms 84 are inserted between the top and bottom fixtures, the extending sections 86 positioned on the outside portions of the arms contact the tip portion 88 of each respective PCB handling device 76, causing the devices to be moved laterally away from the edge of the PCB. In a preferred embodiment, each mechanical arm 84 has two extending sections 86 configured in the form of cam-shaped surfaces. A first extending section 98 is located adjacent a leading end 100 of the arm, and a second extending section 102 is located adjacent an opposite end 104 of the arm. The two extending sections are offset vertically. The first extending section 98 is positioned near the bottom of each arm and the second extending section 102 is positioned near the top of each arm.

When used in conjunction with a mechanical reloading device comprising such mechanical arms, PCB handling devices having two differently sized tip portions are used. A pair of first PCB handling devices 76 each having a long tip portion 88 are arranged within the top test fixture 66 at positions furthest away from the mechanical arms 84. A pair of second PCB handling devices 76, each having a relatively short tip portion 88, are arranged placed within the top test fixture 66 at positions closest to the mechanical arms 84. Use of long tipped and short tipped PCB handling devices in this manner facilitates use of the mechanical arms to release and unload the PCB in the following manner. In a preferred embodiment, the tip portion of each first PCB handling device has an axial length of approximately 14.3 millimeters, and the tip portion of each second PCB handling device has an axial length of approximately 4.7 millimeters. As the mechanical arms 84 enter the test apparatus and pass between the top and bottom test fixtures, each first extending section 98, positioned at the bottom of each arm, passes underneath the tip portion of the first PCB handling device and only pushes against the longer tip portion of each second PCB handling device.

Simultaneously, each second extending section 102, positioned at the top of each arm, pushes against the tip portion of each second PCB handling device.

Once the mechanical arms have completed their inward movement between the top and bottom test fixtures, the outward pushing action of the first and second extending sections against respective first and second PCB handling devices bends the standoffs away from the PCB and causes each PCB handling device to move laterally outward away from contact with the adjacent edges of the PCB. As each first and second PCB handling device is moved laterally outward the retaining section of each PCB handling device releases the PCB edge and the PCB edge is allowed to pass over the extended diameter section, causing the PCB to be released by gravity downward. The PCB is allowed to drop a short distance onto a top surface 104 of the mechanical arms 84, which are then moved away from between the top and bottom test fixtures to otherwise dispose of the tested PCB.

PCB handling devices of this invention reduce the amount of time incurred in testing PCBs because they eliminate the step of having to manually remove the post-tested PCB from the tooling pins in the bottom test fixture before loading a new PCB and proceeding with a next test. Use of PCB handling devices of this invention speeds up the testing operation because it allows the test operator to reload the bottom test fixture with a new PCB before, or at the same time that, the post-test PCB is being removed from its retained position on the top test fixture. This effectively converts the PCB test procedure from a serial operation, i.e., an operation where the post-test PCB must be unloaded before the new PCB can be loaded for testing, to a parallel operation, i.e., an operation where the new PCB can be loaded while the post-test PCB is being unloaded.

Although preferred embodiments of PCB handling devices according to principles of this invention have been specifically described and illustrated, it is to be understood that variations or alternative embodiments of PCB handling devices apparent to those skilled in the art are within the scope of this invention. Since many such variations may be made, it is to be understood that within the scope of the following claims, this invention may be practiced otherwise than specifically described.

What is claimed is:

1. A test fixture assembly for releasably retaining a printed circuit board on a test fixture and for facilitating transfer of the board to and removal of the board from the fixture during a sequential test operation in which circuit boards under test are held in a test position, tested by a printed circuit board test apparatus, removed from the test position, and unloaded from the fixture, the test fixture assembly comprising:

a plurality of substantially parallel pin-supporting fixturing plate members;

a plurality of conductive test pins disposed in the test fixture for alignment with circuits on the board under test, the test pins supported in the test position within the fixture by the fixturing plate members; and at least one board retaining assembly mounted to the fixture, the board retaining assembly including a board retaining device positioned adjacent a surface of the test fixture, and an elongated support member disposed perpendicularly through the fixture and rigidly connected at one end to one of the plate members of the fixture, the board retaining device affixed to a free end of the support member spaced from its rigid connection to the plate member, the support member being attached to the fixture so that its free end moves angularly relative to the fixturing plate members in response to a lateral force applied to the board retaining device in a direction away from the board under test, the support member having a normal position for mounting the board retaining device in a first position for releasably engaging an edge of the printed circuit board to firmly hold the board on the surface of the test fixture, the support member having a board release position in which said lateral force applied to the board retaining device moves the free end of the support member away from the board to move the board retaining device to a second position released from engagement with the edge of the board to thereby facilitate removal of the board from the test fixture.

2. Apparatus according to claim 1 in which the board retaining device comprises:

a tip portion extending axially a distance along the device from a first end;

an enlarged diameter section adjacent the tip portion and remote from the first end, wherein the enlarged diameter section has a diameter greater than the tip portion and has a cam-shaped outside surface that projects radially outward from the device; and a board retaining section extending axially a distance along the device between the enlarged diameter section and a second end of the device opposite from the first end, wherein the board retaining section includes an outside surface shaped to engage the edge of the printed circuit board, and wherein the second end of the device is adapted for connection to the free end of the support member.

3. Apparatus according to claim 2 wherein the enlarged diameter section has a tapered outside surface that tapers wider in a direction toward the surface of the fixture to which the board is mounted.

4. A printed circuit board test fixture of the type having a plurality of conductive test pins supported for alignment with test circuits on a printed circuit board under test mounted to the test fixture, the test fixture having at least one device for releasably retaining the printed circuit board on the test fixture, the device comprising:

a tip portion extending axially along the device a distance from a first end of the device toward a second end of the device opposite the first end, and wherein tip portion is adapted to project outwardly a distance away from a surface of the test fixture;

an enlarged diameter section adjacent the tip portion and remote from the first end and having a diameter greater than the tip portion, wherein the enlarged diameter section extends axially along the device a distance toward the second end, and wherein the enlarged diameter section projects outwardly a distance away from the surface of the test fixture, and wherein the enlarged diameter section has an outer surface adapted to facilitate passage of an edge of the printed circuit board thereby; and a retaining section adjacent the enlarged diameter section and extending axially along the device a distance toward the second end, wherein the retaining section is adapted to project outwardly a distance away from the outside surface of the test fixture, and wherein the retaining section has an outside surface adapted to engage and retain an edge of a printed circuit board after it has passed over the outside surface of the enlarged diameter section, and wherein the second end is adapted to accommodate attachment with a laterally movable member of the test fixture.

5. Apparatus according to claim 4 wherein the enlarged diameter section has a cam-shaped outside surface to effect lateral movement of the device within the test fixture upon contact between the enlarged diameter section and an edge of the printed circuit board to facilitate passage of the printed circuit board thereby.

6. A test fixture assembly for releasably retaining a printed circuit board on a test fixture and for facilitating transfer of the board to and removal of the board from the fixture during a sequential test operation in which boards under test are held in a test position, tested by a printed circuit board test apparatus, removed from the test position, and unloaded from the fixture, the test fixture assembly comprising:

- a plurality of substantially parallel pin-supporting fixturing plate members;
- a plurality of conductive test pins disposed in the test fixture for alignment with circuits on the board under test, the test pins supported in the test position within the fixture by the fixturing plate members;
- a plurality of board retaining devices positioned around the periphery of the test fixture adjacent a board-receiving surface of the test fixture, each board retaining device having a tip portion at a free end configured to contact an edge of a printed circuit board, and a section adjacent the tip portion to urge the board retaining device away from the edge and cause the board handling device to engage and retain the edge as the printed circuit board passes over the board handling device; and
- means for movably supporting the board retaining devices on the test fixture, the support means being disposed perpendicularly through the test fixture and having a normal position for mounting the board retaining devices in a first position for releasably engaging an edge of the printed circuit board to firmly hold the board on the surface of the test fixture, the support means having a board release position in which a lateral force applied to the board retaining devices moves the board retaining devices to a second position released from engagement with the edge of the board to thereby facilitate removal of the board from the test fixture.

7. Apparatus according to claim 6 in which the board retaining device comprises:

- an enlarged diameter section adjacent the tip portion and remote from the free end, wherein the enlarged diameter section has a diameter greater than the tip portion and has a cam-shaped outside surface that projects radially outward from the device; and
- a board retaining section extending axially a distance along the device between the enlarged diameter section and an end of the device opposite from the free end that is connected to the free end of the support means, and wherein the board retaining section includes an outside surface shaped to engage the edge of the printed circuit board.

8. Apparatus according to claim 7 wherein the enlarged diameter section has a tapered outside surface that tapers wider in a direction toward the surface of the fixture to which the board is mounted.

9. A test apparatus to facilitate sequential loading, testing, removal and reloading of printed circuit boards in the test apparatus, comprising:

- a first test fixture;
- a second test fixture spaced from and facing the first test fixture;
- test pins in the first and second test fixtures for testing circuits on opposite faces of a printed circuit board mounted in a test position on the first test fixture; and
- a number of board handing devices projecting outwardly away from a surface of the second test fixture and facing the first test fixture, each board handling device including means to engage an edge of a printed circuit board and impose a force against the edge in response to the printed circuit board passing across a surface of the board handling device, each board handling device being attached to a respective support member that extends perpendicularly through the second test fixture, each support member being movable laterally in the second fixture from a lateral force applied to it from a respective board handling device;
- the first and second test fixtures being movable toward each other so the test pins thereon contact the opposite sides of the circuit board for conducting a test of the circuits on the board, said movement of the fixtures toward each other automatically causing the board under test to contact and move each board handling device to a position engaging the board to retain the board on the second test fixture and thereby remove the board from the first test fixture.

10. Apparatus according to claim 9 including board transfer means for applying a lateral force to each board handling device to release each board handling device from engagement with the board to remove the board from the second test fixture.

* * * * *